United States Patent
Jeong

(10) Patent No.: US 7,414,849 B2
(45) Date of Patent: Aug. 19, 2008

(54) PLASMA DISPLAY APPARATUS

(75) Inventor: Kwang-Jin Jeong, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 98 days.

(21) Appl. No.: 11/598,569

(22) Filed: Nov. 14, 2006

(65) Prior Publication Data

US 2007/0127215 A1 Jun. 7, 2007

(30) Foreign Application Priority Data

Dec. 6, 2005 (KR) .................... 10-2005-0117883

(51) Int. Cl.
*H05K 7/20* (2006.01)
*G06F 1/16* (2006.01)

(52) U.S. Cl. .................. 361/710; 361/704; 361/714; 313/46; 313/582; 345/66

(58) Field of Classification Search ............. 361/681, 361/683, 700–704, 709–714, 719; 165/80.3, 165/185; 313/17, 24, 44, 46, 47, 48, 582–587, 313/634; 345/60, 66, 68, 76, 77, 94, 204–206; 349/20, 32, 56–59, 121, 161; 312/223.2, 312/223.3; 362/224, 225, 237–241, 260, 362/294, 297

See application file for complete search history.

(56) References Cited

U.S. PATENT DOCUMENTS

| 7,215,549 | B2 * | 5/2007 | Kim ........................ 361/704 |
| 7,315,451 | B2 * | 1/2008 | Kim et al. ................ 361/704 |
| 2005/0243106 | A1 * | 11/2005 | Bae et al. .............. 345/679 |
| 2006/0109206 | A1 * | 5/2006 | Kim ........................ 345/60 |

* cited by examiner

*Primary Examiner*—Michael V Datskovskiy
(74) *Attorney, Agent, or Firm*—Stein, McEwen & Bui, LLP

(57) ABSTRACT

A plasma display apparatus including: a plasma display panel; a non-conductive chassis disposed on a rear portion of the plasma display panel to support the plasma display panel; a circuit unit disposed on a rear portion of the chassis to drive the plasma display panel; and a conductive member disposed between the plasma display panel and the chassis, having at least a part that is slit and protruded toward the chassis. In addition, the circuit unit includes a grounding portion having a grounding voltage and the grounding portion is electrically connected to the protruding portion of the conductive member.

23 Claims, 6 Drawing Sheets

Cut-away to show multilayer structure

PLASMA DISPLAY APPARATUS

CROSS-REFERENCE TO RELATED PATENT APPLICATIONS

This application claims the benefit of Korean Application No. 2005-117883, filed Dec. 6, 2005, in the Korean Intellectual Property Office, the disclosure of which is incorporated herein in its entirety by reference.

BACKGROUND OF THE INVENTION

1. Field of the Invention

Aspects of the present invention relate to a plasma display apparatus, and more particularly, to a plasma display apparatus having light weight and improved grounding performance.

2. Description of the Related Art

Plasma display apparatuses including plasma display panels are flat panel display apparatuses to display images using gas discharge. The plasma display apparatuses can be used to provide a large screen with superior characteristics in terms of image quality, thickness, weight, and viewing angle.

In particular, in order to fabricate the plasma display apparatus having a light weight, a chassis that supports the plasma display panel should be thin or a material of the chassis should be a light weight material. However, if the chassis supporting the large plasma display panel becomes too thin when the size of the flat panel display increases, a structure of the plasma display apparatus becomes too weak. Therefore, a structural stability may be reduced by making the chassis too thin. In order to solve this problem, the chassis may be formed of a plastic material having light weight, besides aluminum that is generally used to form the chassis. However, if the chassis is formed of such a plastic material, the chassis is generally not conductive, and thus, a circuit unit cannot be grounded by the chassis.

SUMMARY OF THE INVENTION

Aspects of the present invention provide a plasma display apparatus having a light weight and high grounding performance.

According to an aspect of the present invention, there is provided a plasma display apparatus including: a plasma display panel; a non-conductive chassis disposed on a rear portion of the plasma display panel to support the plasma display panel; a circuit unit disposed on a rear portion of the chassis and including circuit units for driving the plasma display panel; and a conductive member disposed between the plasma display panel and the chassis, and the conductive member having at least a part that is slitted and protruded toward the chassis, wherein the circuit unit includes a grounding portion having a grounding voltage and the grounding portion is electrically connected to the protruding portion of the conductive member.

According to another aspect of the present invention, there is provided a plasma display apparatus including: a plasma display panel; a non-conductive chassis disposed on a rear portion of the plasma display panel to support the plasma display panel; a circuit unit disposed on a rear portion of the chassis and including at least one driving unit to drive the plasma display panel; a thermal conductive sheet disposed between the plasma display panel and the chassis, the thermal conductive sheet having an electrical conductivity; and a conductive connection member, a side of which is fixed on the thermal conductive sheet and the other side of which protrudes toward the chassis, wherein the circuit unit includes a grounding portion having a grounding voltage, and the grounding portion is electrically connected to the thermal conductive sheet by the connection member.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
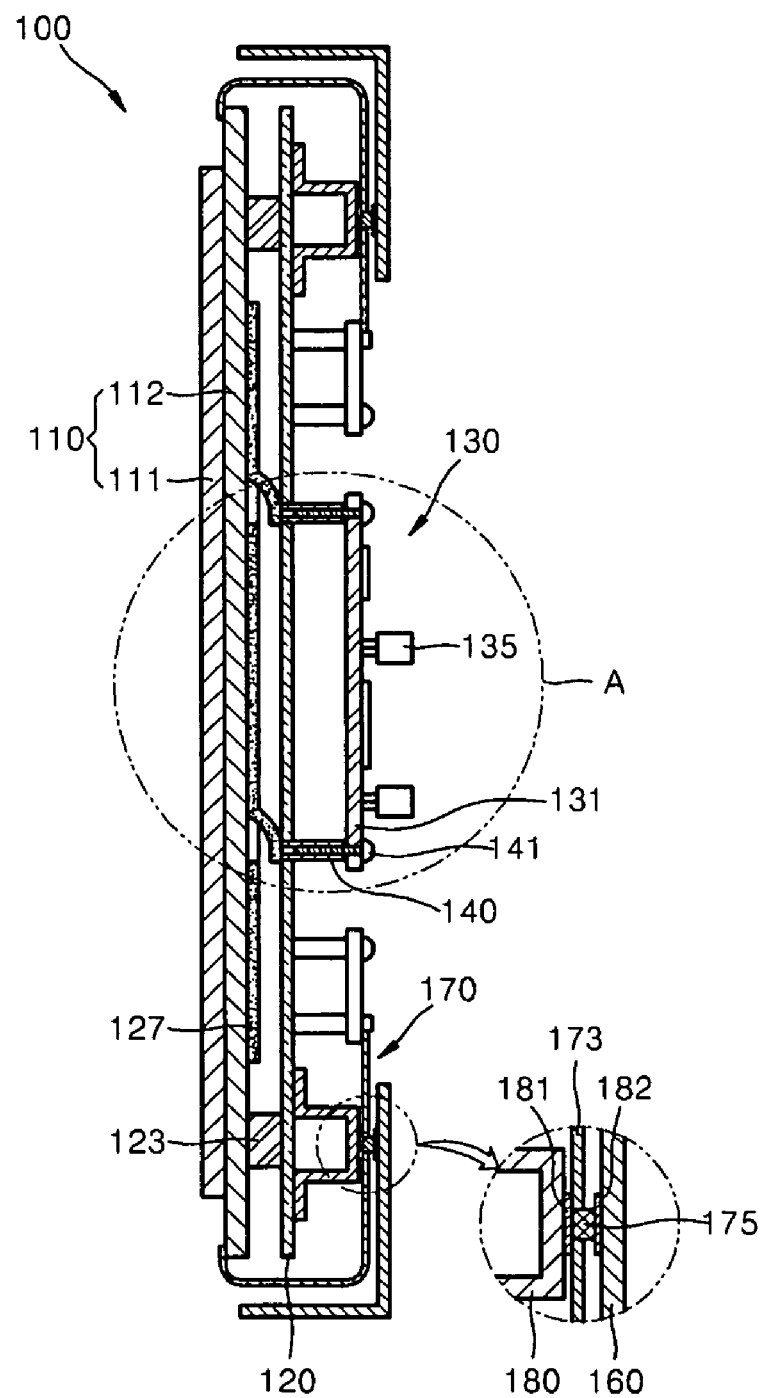
FIG. 1 is a cross-sectional view of a plasma display apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
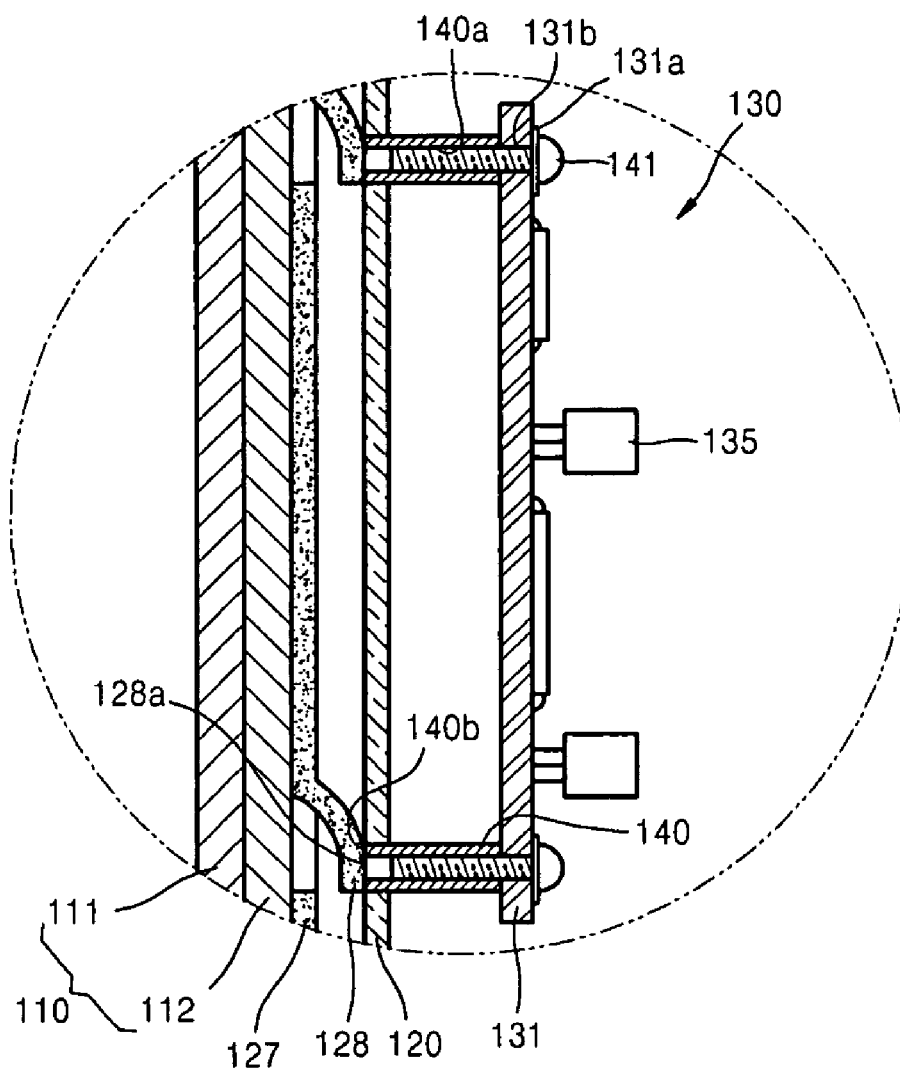
FIG. 2 is an enlarged cross-sectional view of part A in the plasma display apparatus of FIG. 1.

FIGS. 1 and 2 illustrate a plasma display apparatus 100 according to an embodiment of the present invention. FIG. 1 is a cross-sectional view of the plasma display apparatus 100, and FIG. 2 is an enlarged cross-sectional view of part A in the plasma display apparatus 100 of FIG. 1.

Referring to FIGS. 1 and 2, the plasma display apparatus 100 includes a plasma display panel 110, a chassis 120, and a circuit unit 130.

While not required in all aspects, the plasma display panel 110 displays images using a gas discharge, and includes a front panel 111 and a rear panel 112 that are coupled to each other.

The chassis 120 is disposed on a rear portion of the plasma display panel 110 in order to support the plasma display panel 110. The chassis 120 is formed of a non-conductive material, that is, it may be formed of a plastic material.

Figure 6:
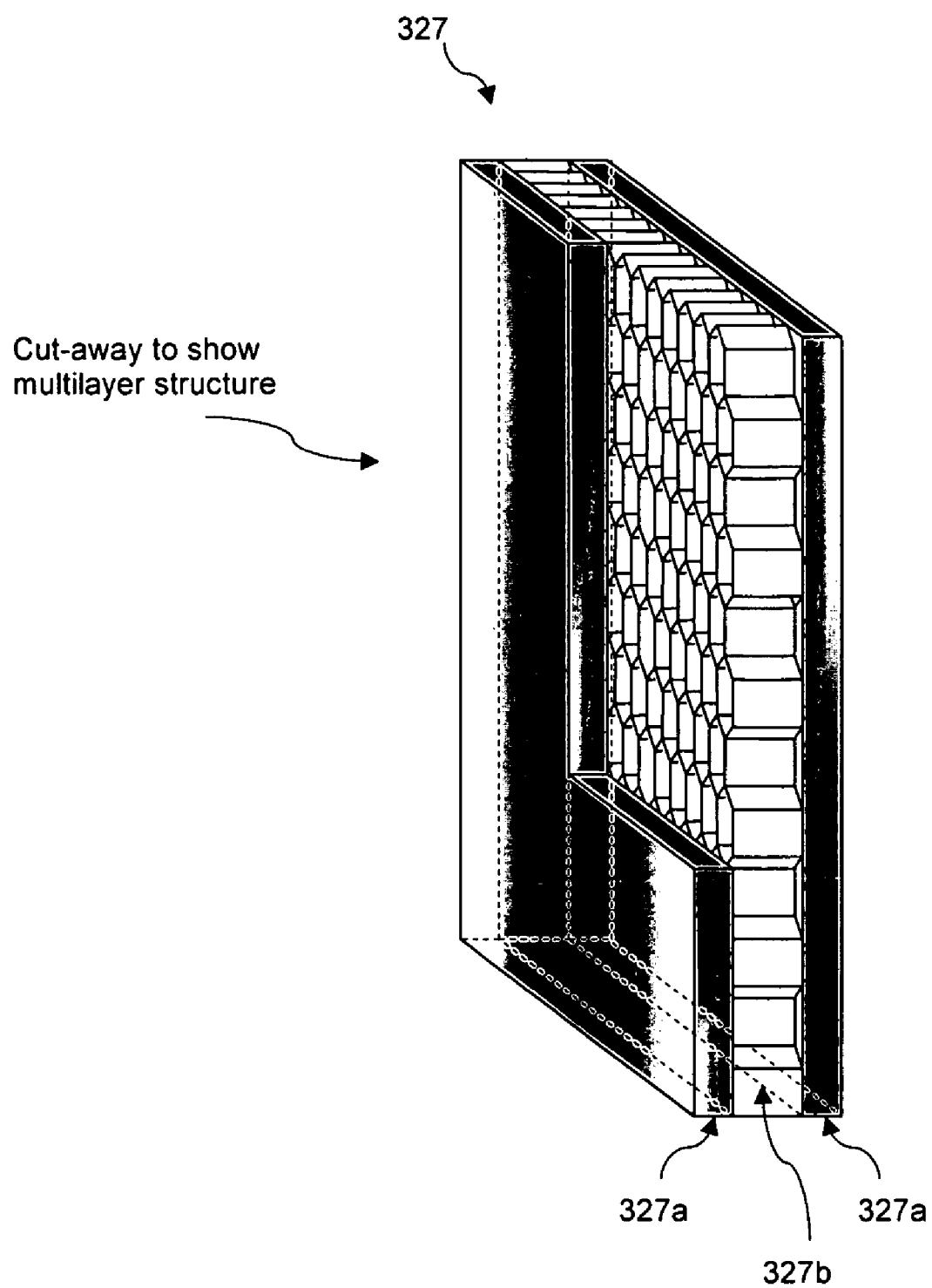
FIG. 6 is an example of a structure of a conductive member according to an embodiment of the present invention.

A conductive member 127 is disposed between the plasma display panel 110 and the chassis 120. The conductive member 127 performs a grounding operation of the circuit unit 130, and diffuses heat generated by the plasma display panel 110. The conductive member 127 is formed as a single sheet, a side of which is attached to a rear surface of the plasma display panel 110 using an adhesive (not shown), and the other side of which is separated from the chassis 120. Although described as a single sheet, it is understood that the single sheet of the conductive member 127 may be multilayered. FIG. 6 shows an example of a multilayered single sheet 327 having a structure 327b sandwiched and bonded between layers 327a for good conductivity and/or heat dissipating qualities. Thus, outer air can be induced between the conductive member 127 and the chassis 120 for dissipating the heat of the conductive member 127. The plasma display panel 110 and the chassis 120 are fixed to each other using dual-sided adhesive tape 123.

The circuit unit 130 is disposed on a rear portion of the chassis 120. The circuit unit 130 includes a plurality of substrates 131 to support driving units to drive the plasma display panel 110. Bosses 140 are inserted into the chassis 120, and each of the bosses 140 has a thread on an inner circumferential surface 140a thereof as shown in FIG. 2. The substrates 131 are separated a predetermined distance from the chassis 120 by the bosses 140.

Circuit lines (not shown) are formed on the substrate 131 to process predetermined electric signals, and electronic devices 135 are mounted on the circuit lines. At least one of the circuit lines is a circuit line to provide a grounding voltage. The substrates 131 include penetration holes 131b, through which conductive screws 141 that are inserted into the bosses 140 are inserted. However, a grounding portion 131a surrounding at least one of the penetration holes 131b is formed on each of the substrates 131, and the grounding portion 131a is electrically connected to at least one of the circuit lines (not shown) providing the grounding voltage. As described above, the conductive screws 141 are inserted into the penetration holes 131b to be coupled to the bosses 140.

Figure 3:
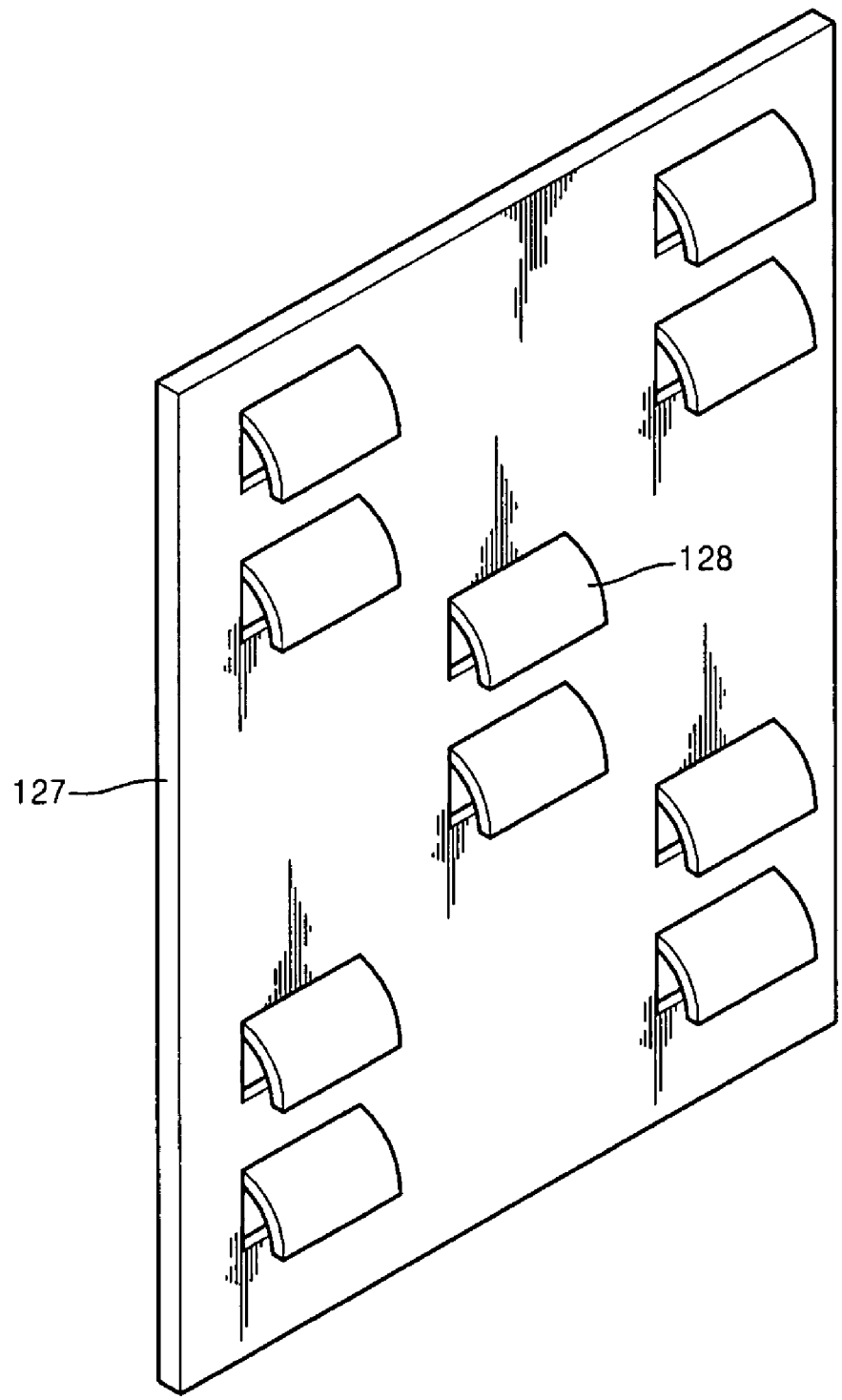
FIG. 3 is a perspective view of a conductive member shown in FIG. 2.

The bosses 140 are electrically connected to the conductive member 127, and this will be described in more detail with reference to FIGS. 2 and 3. FIG. 3 is a perspective view of the conductive member 127 of FIG. 1. Referring to FIGS. 2 and 3, protruding portions 128 are some parts of the conductive member 127 that are slit and protruded toward the chassis 120. An end part 128a of each protruding portion 128 contacts an end portion 140b of the boss 140. Therefore, the protruding portion 128 is pushed by the end portion 140b of the boss 140. In particular, if the conductive member 127 is formed of a material including a metal, the protruding portion 128 can have elasticity. The material may be metal such as steel, aluminum, or copper. Since the protruding portion 128 contacts the end portion 140b of the boss 140 with the elasticity, the mechanical contacting force between the protruding portion 128 and the boss 140 can increase. The increase of the mechanical contacting force makes the electrical connection between the conductive member 127 and the boss 140 confirm.

Since the grounding portion 131a, the screw 141, the boss 140, and the conductive member 127 are electrically connected to each other, the conductive member 127 can provide the circuit unit 130 with the grounding voltage.

The protruding portion 128 may be formed on the conductive member 127 so that one protruding portion 128 can correspond to each of the bosses 140, however, the protruding portions 128 may be formed so that one protruding portion 128 can correspond to a plurality of bosses 140.

The circuit unit 130 transmits electric signals to the plasma display panel 110 through signal transmission members 170, and the signal transmission member 170 may be a flexible printed cable (FPC), a tape carrier package (TCP), or a chip on film (COF). In the present embodiment, the signal transmission members 170 disposed on upper and lower sides of the chassis 120 are TCPs.

In the TCP 170, electronic devices 175 are mounted on a wiring portion 173, and a cover member 160 is disposed so as to surround a portion of the TCP 170 where the electronic devices 175 are mounted. The cover member 160 dissipates the heat generated from the electronic devices 175, and prevents the TCPs 170 from being damaged. In order to increase the heat dissipation efficiency of the cover member 160, a thermal conductive sheet 182 is inserted between the TCP 170 and the cover member 160. In addition, grease 181 is inserted between the TCP 170 and a reinforcing member 180 in order to dissipate the heat generated from the electronic devices 175 through the chassis 120 and reduce a compression force applied to the electronic devices 175.

Figure 4:
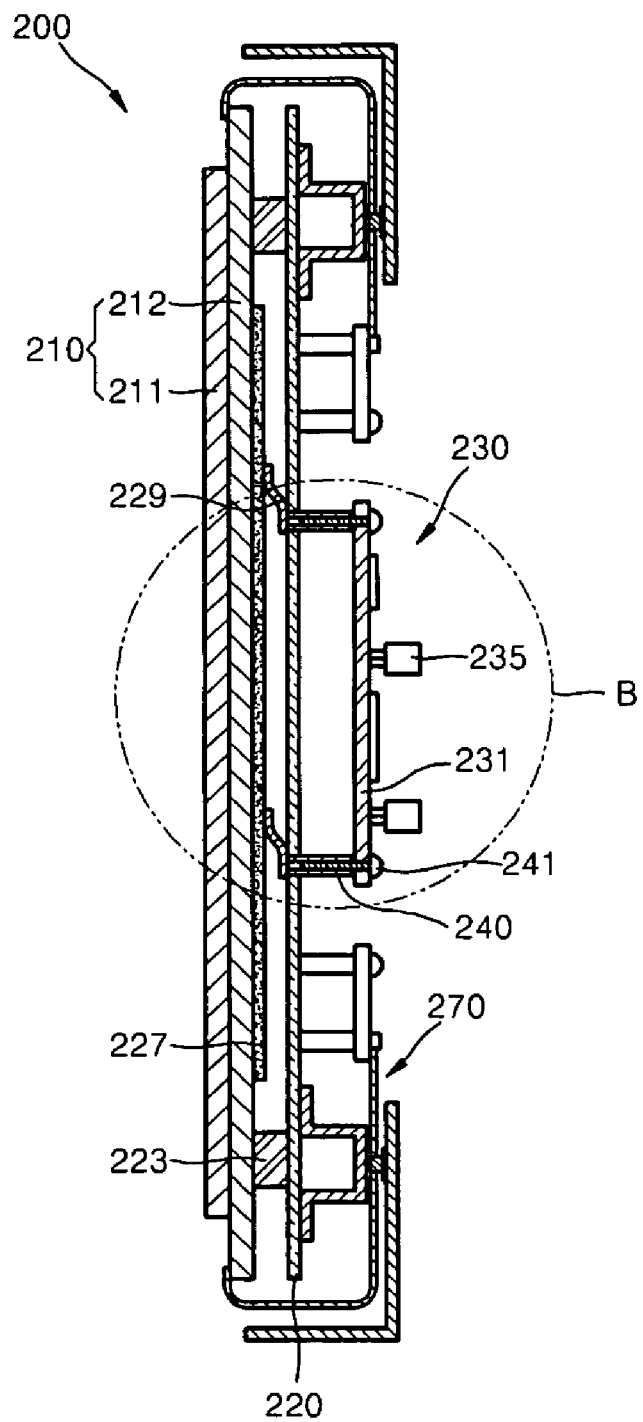
FIG. 4 is a schematic cross-sectional view of a plasma display apparatus according to another embodiment of the present invention.
Figure 5:
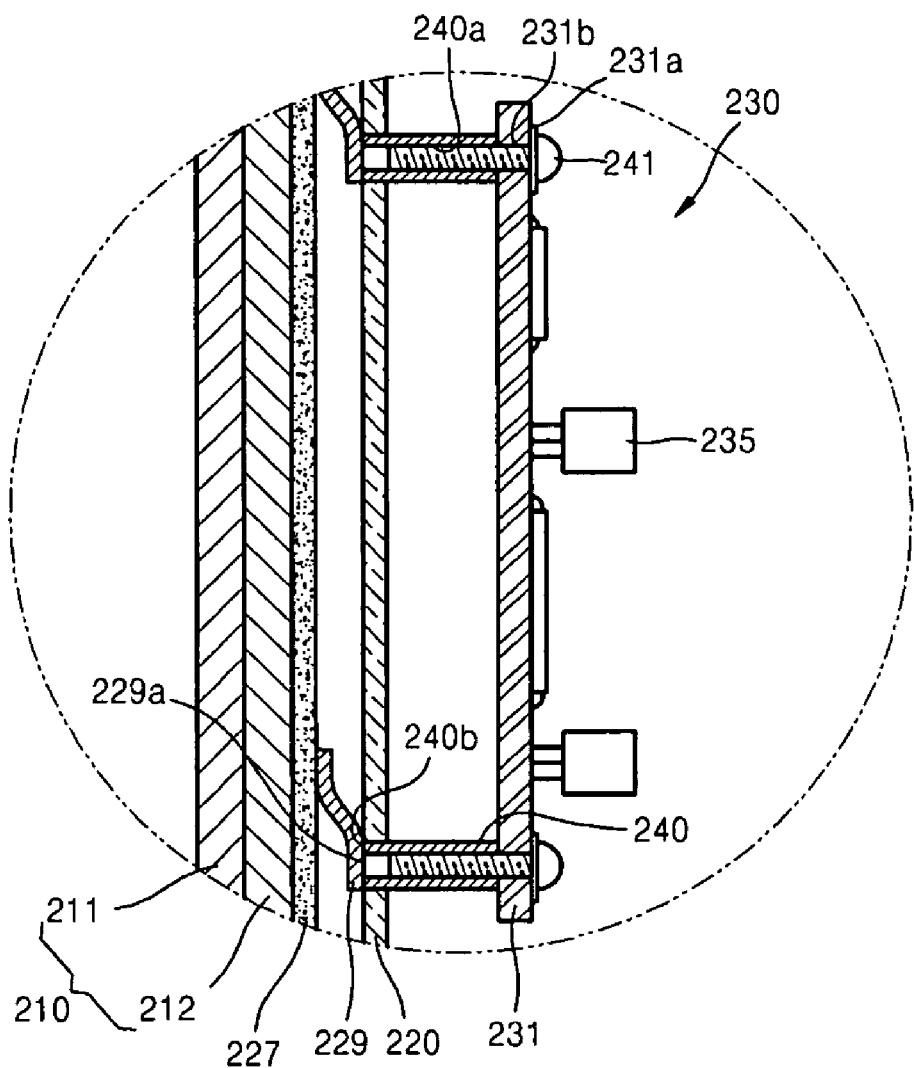
FIG. 5 is an enlarged cross-sectional view of part B in the plasma display apparatus of FIG. 4.

FIGS. 4 and 5 illustrate a plasma display apparatus 200 according to another embodiment of the present invention. FIG. 4 is a schematic cross-sectional view of the plasma display apparatus 200, and FIG. 5 is an enlarged cross-sectional view of part B shown in FIG. 4. Hereinafter, differences of the present embodiment from the previous embodiment will be described.

The plasma display apparatus 200 includes a plasma display panel 210, a chassis 220, and a circuit unit 230.

The plasma display panel 210 includes a front panel 211 and a rear panel 212, and displays images. In addition, the chassis 220 is disposed on a rear portion of the plasma display panel 210 to support the plasma display panel 210.

A thermal conductive sheet 227 is disposed between the plasma display panel 210 and the chassis 220. The thermal conductive sheet 227 has an electric conductivity, and diffuses a heat generated on the plasma display panel 210 to the periphery. The thermal conductive sheet 227 is formed as a single sheet, a side of which is attached to a rear surface of the plasma display panel 210 using an adhesive (not shown), and the other side of which is separated from the chassis 220. Therefore, outer air can be induced between the thermal conductive sheet 227 and the chassis 220 to dissipate the heat of the thermal conductive sheet 227. The plasma display panel 210 and the chassis 220 are fixed to each other using dual-sided adhesive tape 223.

The circuit unit 230 is disposed on a rear portion of the chassis 220. The circuit unit 230 includes a plurality of substrates 231 to support driving units to drive the plasma display panel 210. Bosses 240 are inserted into the chassis 220, and each of the bosses 240 includes a thread on an inner circumferential surface 240a thereof. The substrates 231 are separated a predetermined distance from the chassis 220 by the bosses 240.

Circuit lines (not shown) for processing predetermined electric signals are formed on the substrates 231, and electronic devices 235 are mounted on the circuit lines. At least one of the circuit lines is a circuit line providing a grounding voltage. Penetration holes 231b, through which the screws 241 that are inserted into the bosses 240 are inserted, are formed on the substrates 231. In addition, a grounding portion 231a surrounding at least one of the penetration holes 231b is formed on the substrate 231, and thus, the grounding portion 231a and the circuit line providing the grounding voltage are electrically connected to each other. As described above, conductive screws 241 are inserted into the penetration holes 231b and coupled to the bosses 240.

Conductive connection members 229 are disposed on the thermal conductive sheet 227 corresponding to the chassis 220. A side of the connection member 229 is fixed on the thermal conductive sheet 227, and the other side of the connection member 229 extends while bending toward the chassis 220. In addition, a portion 229a of the connection member 229 is pushed by an end portion 240b of the boss 240. Since the connection member 229 has elasticity, the mechanical contacting force between the connection member 229 and the boss 240 can be increased by the elasticity of the bent connection member 229. The connection member 229 may be formed of a metal material having high elasticity. The increase of the mechanical contacting force makes the electric connection between the connection member 229 and the boss 240 confirm.

Since the grounding portion 231a, the screw 241, the boss 240, the connection member 229, and the thermal conductive sheet 227 are electrically connected to each other, the thermal conductive sheet 227 can provide the circuit unit 230 with the grounding voltage.

The connection members 229 may be arranged in one-to-one correspondence to the bosses 240, however, one connection member 229 may correspond to a plurality of bosses 240 for the sake of convenience.

According to aspects of the plasma display apparatus of the present invention, the grounding performance of the circuit unit can be improved. Therefore, the manufacturer can freely design the circuit unit.

In addition, although not required in all aspects since the chassis can be formed of a material including plastic, the weight of the chassis can be reduced and fabrication costs of the chassis can be reduced.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A plasma display apparatus comprising:
   a plasma display panel;
   a non-conductive chassis disposed on a rear portion of the plasma display panel to support the plasma display panel;
   a circuit unit disposed on a rear portion of the chassis and including driving units to drive the plasma display panel; and
   a conductive member disposed between the plasma display panel and the chassis, and the conductive member having at least a part that is slit and protruded toward the chassis, wherein the circuit unit includes a grounding portion having a grounding voltage and the grounding portion is electrically connected to the protruding portion of the conductive member.

2. The plasma display apparatus of claim 1, wherein the conductive member is thermally and electrically conductive.

3. The plasma display apparatus of claim 1, wherein the protruding portion of the conductive member is elastically bent.

4. The plasma display apparatus of claim 1, wherein the conductive member includes a metal.

5. The plasma display apparatus of claim 1, wherein a side of the conductive member contacts the plasma display panel, and the other side of the conductive member is separated from the chassis.

6. The plasma display apparatus of claim 1, wherein the conductive member is formed as a sheet.

7. The plasma display apparatus of claim 6, wherein the conductive member has a multilayered structure to increase one or more of stiffness, flexibility, strength, damping, electrical conductivity, and thermal conductivity.

8. The plasma display apparatus of claim 1, wherein the circuit unit is supported by bosses inserted in the chassis, and the protruding portion contacts the bosses.

9. The plasma display apparatus of claim 8, wherein the grounding portion is electrically connected to the boss by a conductive screw that is inserted into a penetration hole in the circuit unit.

10. The plasma display apparatus of claim 1, wherein the chassis includes a plastic material.

11. A plasma display apparatus comprising:
    a plasma display panel;
    a non-conductive chassis disposed on a rear portion of the plasma display panel to support the plasma display panel;
    a circuit unit disposed on a rear portion of the chassis and including a driving unit to drive the plasma display panel;
    a thermal conductive sheet disposed between the plasma display panel and the chassis, the thermal conductive sheet having an electrical conductivity; and
    a conductive connection member, a side of which is fixed on the thermal conductive sheet and the other side of which protrudes toward the chassis,
    wherein the circuit unit includes a grounding portion having a grounding voltage, and the grounding portion is electrically connected to the thermal conductive sheet by the connection member.

12. The plasma display apparatus of claim 11, wherein the connection member is elastically bent.

13. The plasma display apparatus of claim 11, wherein the thermal conductive sheet includes a metal.

14. The plasma display apparatus of claim 13, wherein the thermal conductive sheet has a multilayered structure to increase one or more of stiffness, flexibility, strength, damping, electrical conductivity, and thermal conductivity.

15. The plasma display apparatus of claim 11, wherein a side of the thermal conductive sheet contacts the plasma display panel, and the other side of the thermal conductive sheet is separated from the chassis.

16. The plasma display apparatus of claim 11, wherein the circuit unit is supported by bosses inserted in the chassis, and the connection member contacts at least one boss.

17. The plasma display apparatus of claim 16, wherein the grounding portion is electrically connected to the at least one boss by a conductive screw that is inserted into a penetration hole formed in the circuit unit.

18. The plasma display apparatus of claim 11, wherein the chassis includes a plastic.

19. The plasma display apparatus of claim 11, wherein the connection member includes a metal.

20. A plasma display apparatus comprising:
    a plasma display panel;
    a chassis to support the plasma display panel;
    one or more driving units on the chassis to drive the plasma display panel; and
    a conductive sheet between the plasma display panel and the chassis, the conductive sheet having a connection member protruded toward the chassis and electrically connected to the one or more driving units.

21. The plasma display apparatus of claim 20, further comprising
    one or more substrates to support the one or more driving units;
    conductive screws to connect the one or more substrates to the chassis; and
    conductive bosses attached to the chassis to accept the conductive screws,
        wherein the one or more driving units, the screws, the bosses and at least one connection member are electrically connected to each other.

22. The plasma display apparatus of claim 20, wherein the conductive member is thermally and electrically conductive.

23. The plasma display apparatus of claim 20, wherein the chassis includes a plastic.

* * * * *